United States Patent
Arvin et al.

(10) Patent No.: US 9,379,007 B2
(45) Date of Patent: Jun. 28, 2016

(54) ELECTROMIGRATION-RESISTANT LEAD-FREE SOLDER INTERCONNECT STRUCTURES

(71) Applicant: GLOBALFOUNDRIES Inc., Grand Cayman (KY)

(72) Inventors: Charles L. Arvin, Hopewell Junction, NY (US); Kenneth Bird, Hopewell Junction, NY (US); Charles C. Goldsmith, Hopewell Junction, NY (US); Sung K. Kang, Chappaqua, NY (US); Minhua Lu, Yorktown Heights, NY (US); Clare J. McCarthy, Hopewell Junction, NY (US); Eric D. Perfecto, Hopewell Junction, NY (US); Srinivasa S. N. Reddy, Lagrangeville, NY (US); Krystyna W. Semkow, Hopewell Junction, NY (US); Thomas A. Wassick, Hopewell Junction, NY (US)

(73) Assignee: GLOBALFOUNDRIES INC., Ugland House (KY)

(*) Notice: Subject to any disclaimer, the term of this patent is extended or adjusted under 35 U.S.C. 154(b) by 391 days.

(21) Appl. No.: 13/874,509

(22) Filed: May 1, 2013

(65) Prior Publication Data

US 2013/0252418 A1 Sep. 26, 2013

Related U.S. Application Data

(62) Division of application No. 13/427,940, filed on Mar. 23, 2012, now abandoned.

(51) Int. Cl.
*H01L 21/321* (2006.01)
*H01L 21/768* (2006.01)
*H01L 23/00* (2006.01)

(52) U.S. Cl.
CPC .......... *H01L 21/7685* (2013.01); *H01L 21/321* (2013.01); *H01L 24/11* (2013.01); *H01L 24/13* (2013.01); *H01L 24/742* (2013.01);
(Continued)

(58) Field of Classification Search
CPC ........... H01L 2224/13084; H01L 2224/13157; H01L 21/7685; H01L 21/768; H01L 24/13; H01L 24/11; H01L 24/742; H01L 21/321
See application file for complete search history.

(56) References Cited

U.S. PATENT DOCUMENTS 5,969,422 A * 10/1999 Ting et al. ............... 257/762
7,122,460 B2 10/2006 Hua
(Continued)

OTHER PUBLICATIONS

Lin et al., "Electromigration in Ni/Sn Intermetallic Micro Bump Joint for 3D IC Chip Stacking", Electronics & Optoelectronics Labs, Industrial Technology Research Institute, Los Angeles, California, 2011 IEEE, pp. 351-357.

(Continued)

*Primary Examiner* — Evan Pert
*Assistant Examiner* — Damon Hillman
(74) *Attorney, Agent, or Firm* — Heslin Rothenberg Farley & Mesiti P.C.; George Blasiak

(57) ABSTRACT

Embodiments of the invention include a lead-free solder interconnect structure and methods for making a lead-free interconnect structure. The structure includes a semiconductor substrate having a last metal layer, a copper pedestal attached to the last metal layer, a barrier layer attached to the copper pedestal, a barrier protection layer attached to the barrier layer, and a lead-free solder layer contacting at least one side of the copper pedestal.

20 Claims, 10 Drawing Sheets

(52) U.S. Cl.
CPC .............. *H01L 24/03* (2013.01); *H01L 24/05* (2013.01); *H01L 24/16* (2013.01); *H01L 24/81* (2013.01); *H01L 2224/0382* (2013.01); *H01L 2224/0401* (2013.01); *H01L 2224/1131* (2013.01); *H01L 2224/1147* (2013.01); *H01L 2224/1184* (2013.01); *H01L 2224/11462* (2013.01); *H01L 2224/11849* (2013.01); *H01L 2224/11903* (2013.01); *H01L 2224/131* (2013.01); *H01L 2224/136* (2013.01); *H01L 2224/1316* (2013.01); *H01L 2224/13017* (2013.01); *H01L 2224/13027* (2013.01); *H01L 2224/1357* (2013.01); *H01L 2224/13083* (2013.01); *H01L 2224/13084* (2013.01); *H01L 2224/13111* (2013.01); *H01L 2224/13147* (2013.01); *H01L 2224/13155* (2013.01); *H01L 2224/13157* (2013.01); *H01L 2224/13562* (2013.01); *H01L 2224/13566* (2013.01); *H01L 2224/16225* (2013.01); *H01L 2224/16227* (2013.01); *H01L 2224/81191* (2013.01); *H01L 2224/81801* (2013.01); *H01L 2924/181* (2013.01)

(56) References Cited

U.S. PATENT DOCUMENTS

| | | | |
|---|---|---|---|
| 7,242,097 B2 | 7/2007 | Hua | |
| 7,332,424 B2* | 2/2008 | Belanger et al. | 438/616 |
| 7,339,275 B2 | 3/2008 | Wang et al. | |
| 7,919,859 B2 | 4/2011 | Zhong et al. | |
| 8,013,444 B2 | 9/2011 | Pang et al. | |
| 8,227,918 B2* | 7/2012 | Lu | H01L 24/05 257/738 |
| 2004/0113235 A1* | 6/2004 | Coolbaugh et al. | 257/532 |
| 2004/0178503 A1* | 9/2004 | Jin et al. | 257/737 |
| 2008/0251927 A1 | 10/2008 | Zhao et al. | |
| 2009/0001248 A1* | 1/2009 | Farinelli et al. | 249/119 |
| 2010/0155115 A1 | 6/2010 | Pang et al. | |
| 2010/0258335 A1* | 10/2010 | Arvin | C25D 5/02 174/126.2 |
| 2011/0147922 A1* | 6/2011 | Bezama et al. | 257/737 |
| 2013/0252418 A1 | 9/2013 | Arvin et al. | |

OTHER PUBLICATIONS

Lu et al., "Comparison of Electromigration Performance for Pb-free Solders and Surface Finishes with Ni UBM", 2008 Electronic Components and Technology Conference, IEEE, pp. 360-365.

Nah et al., "Investigation of Low Cost Flip Chip Under Bump Metallization (UMB) Systems on Cu Pads", 2001 Electronic Components and Technology Conference, IEEE.

Choi et al., "Electromigration of Flip Chip Solder on Cu/Ni(V)/Al Thin Film Under Bump Metallization", 2002 Electronic Components and Technology Conference, IEEE, pp. 1201-1205.

USPTO bibliographical data report; Patent Application Retrieval System (PAIR); U.S. Appl. No. 13/427,940 retrieved from https://ppair.uspto.gov/pair/PrivatePair; May 16, 2016.

* cited by examiner

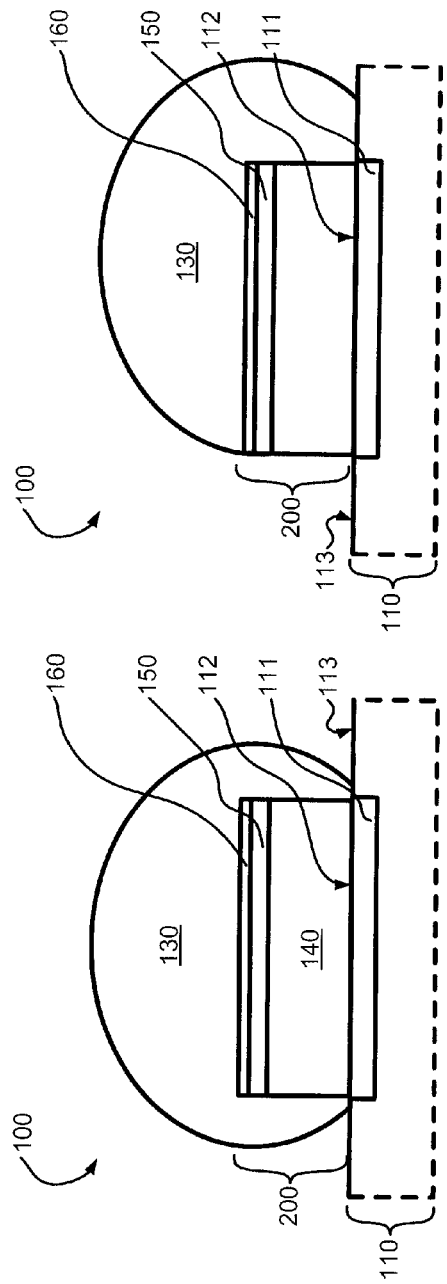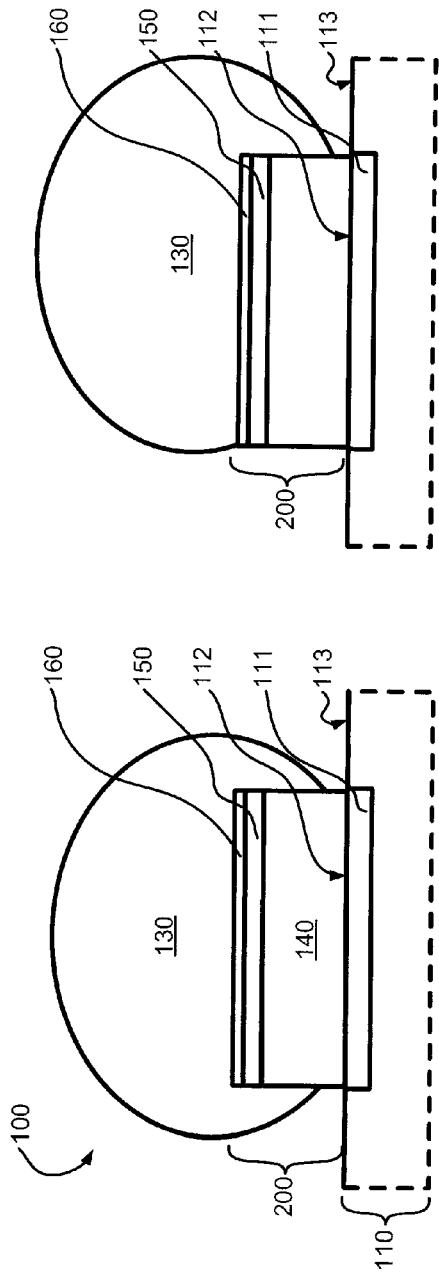
FIG. 1A  FIG. 1B  FIG. 1C  FIG. 1D

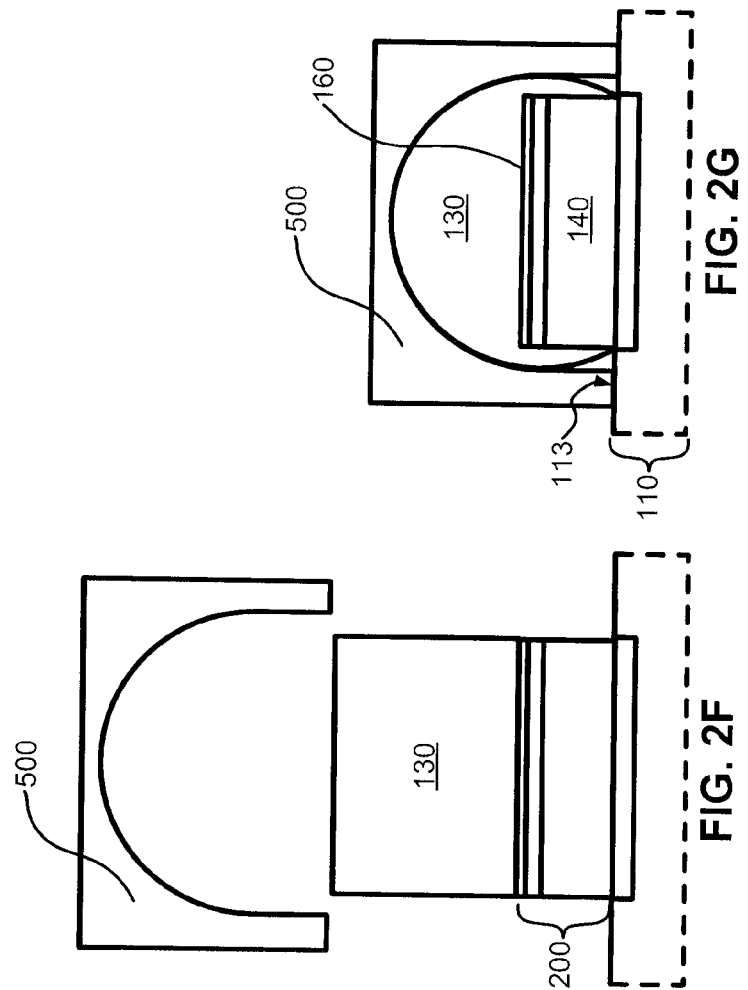

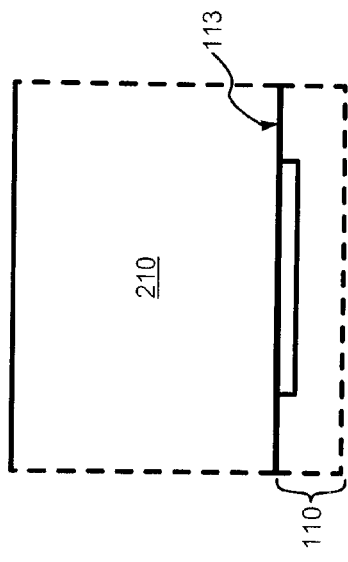
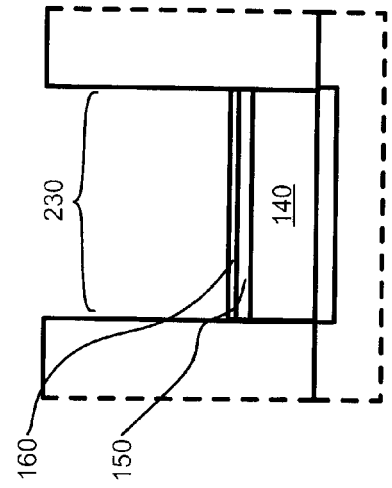
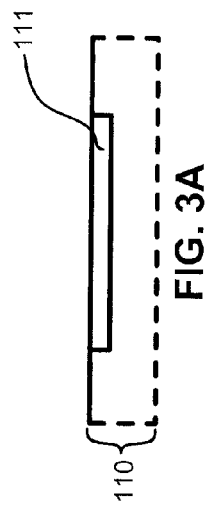
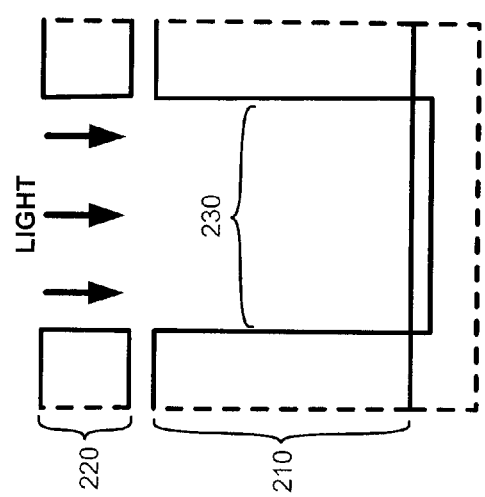

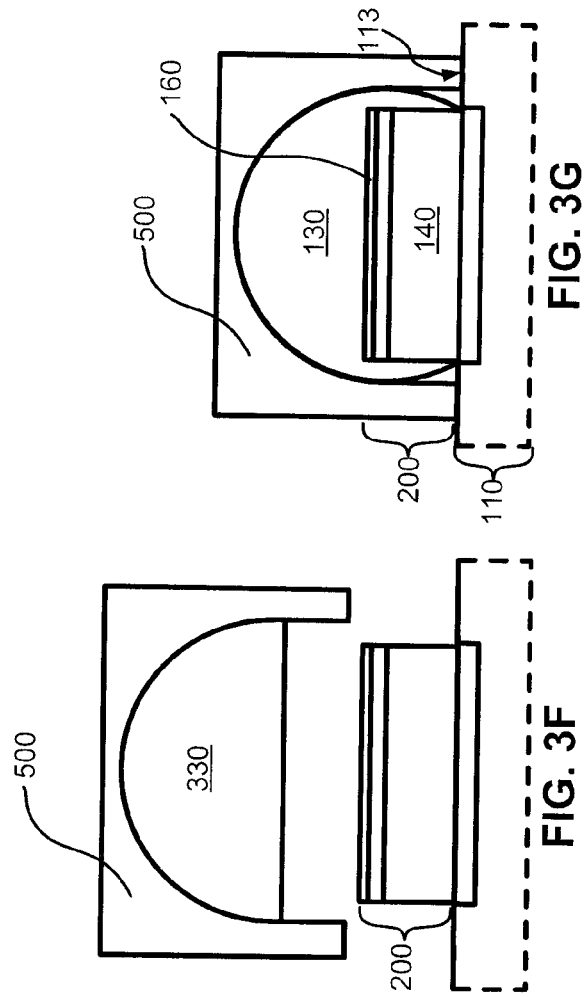

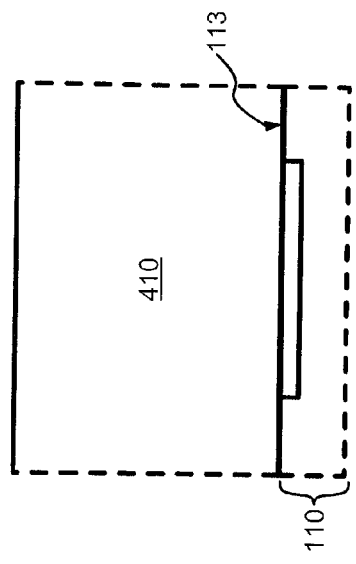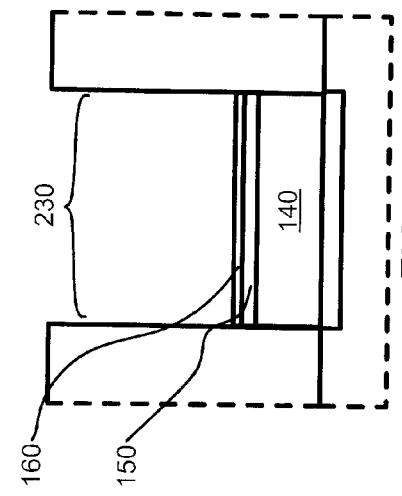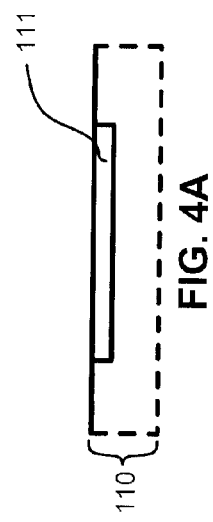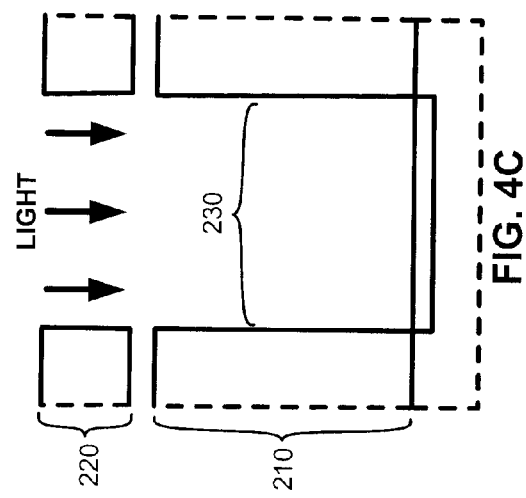

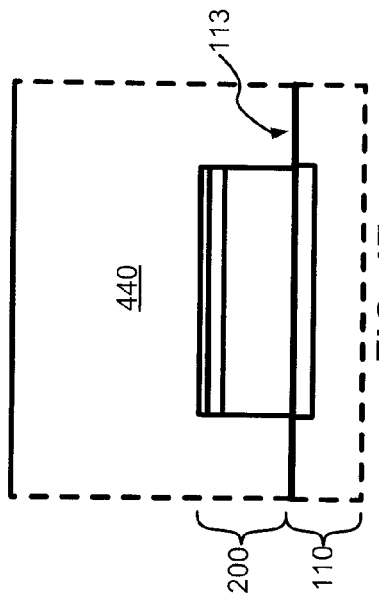
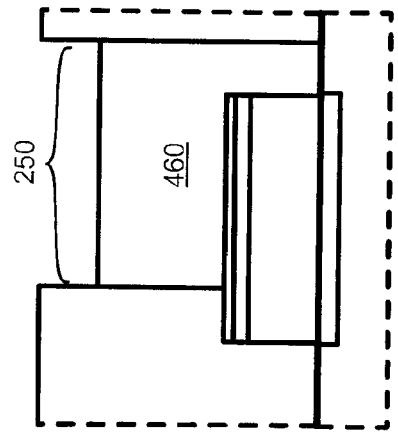
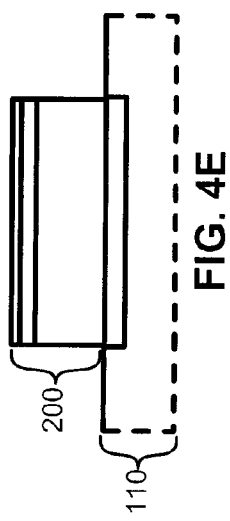
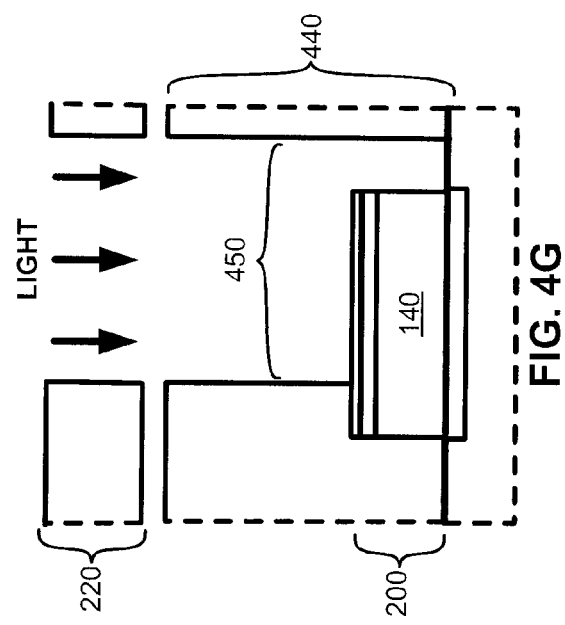

ELECTROMIGRATION-RESISTANT LEAD-FREE SOLDER INTERCONNECT STRUCTURES

This application is a divisional of U.S. patent application Ser. No. 13/427,940, entitled ELECTROMIGRATION-RESISTANT LEAD-FREE SOLDER INTERCONNECT STRUCTURES, filed on Mar. 23, 2012, which is incorporated by reference in its entirety.

BACKGROUND

The present invention generally relates to semiconductor devices, and particularly to lead-free solder interconnect structures.

As semiconductor technology reduces in size, electromigration of metals in interconnect structures may occur. Electromigration refers to the gradual movement of metal atoms caused by momentum transferred to the atoms from electrons moving in the direction of an electric field. As electron momentum is proportional to current, increased current density increases electromigration. This movement of metal atoms may lead to early failure of the semiconductor device due to defects forming in the interconnect structure. Since decreasing the size of an interconnect structure may lead to an increase in current density, reducing the effects of electromigration in turn reduces the resulting defects in the interconnect structure in favor of increased device reliability.

SUMMARY

The present invention relates to lead-free solder interconnect structures featuring improved electromigration performance through the introduction of a source of available copper into the system. This available copper causes the formation of particular intermetallic compounds that, among other things, enhance the overall reliability of the interconnect structure.

A first embodiment of the invention may include a semiconductor substrate having a last metal layer, a copper pedestal attached to the last metal layer, a barrier layer on the copper pedestal, a barrier protection layer on the barrier layer, and a solder layer that directly contacts at least one side of the copper pedestal.

A second embodiment of the invention may include a method of constructing the first embodiment. The method includes providing a semiconductor substrate having a metal layer, forming a copper pedestal coupled to the metal layer, forming a barrier layer on the copper pedestal, forming a barrier protection layer on the barrier layer, forming a solder layer on the barrier protection layer, and pressing a mold over the solder layer so that the solder layer directly contacts at least one side of the copper pedestal.

A third embodiment of the invention may include a method of constructing the first embodiment. The method includes providing a semiconductor substrate having a metal layer, forming a copper pedestal coupled to the metal layer, forming a barrier layer on the copper pedestal, forming a barrier protection layer on the barrier layer, filling a mold with solder, and transferring the solder from the mold to the copper pedestal so that the solder layer directly contacts at least one side of the copper pedestal.

A fourth embodiment of the invention may include a method of constructing the first embodiment. The method includes providing a semiconductor substrate having a metal layer, forming a copper pedestal coupled to the metal layer, forming a barrier layer on the copper pedestal, forming a barrier protection layer on the barrier layer, forming a solder layer on the barrier protection layer so that the solder layer contacts at least one side of the copper pedestal, and reflowing the solder layer.

BRIEF DESCRIPTION OF THE SEVERAL VIEWS OF THE DRAWINGS

FIGS. 1A-1D depict cross-sectional diagrams of four interconnect structures according to one embodiment;

FIGS. 2A-2G depict various stages in the process of producing an interconnect structure according to the exemplary embodiment of FIGS. 1A-1D, wherein a mold is used to shape an electroplated solder layer;

FIGS. 3A-3G depict various stages in the process of producing an interconnect structure according to the exemplary embodiment of FIGS. 1A-1D, wherein a mold is used to transfer solder to an electroplated pedestal structure.

FIGS. 4A-4J depict various stages in the process of producing an interconnect structure according to the exemplary embodiment of FIGS. 1B and 1D, wherein an offset solder layer is formed by electroplating.

DETAILED DESCRIPTION

Figure 2B:
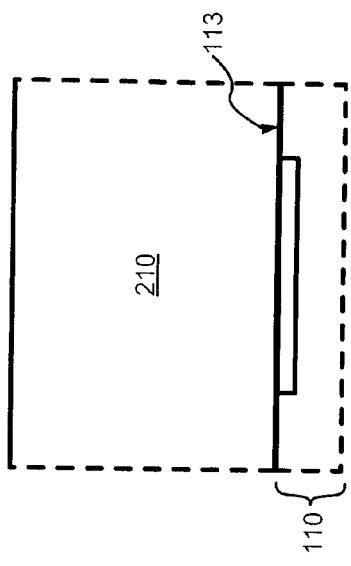

According to at least one embodiment, the utilization of available copper in a lead-free solder interconnect structure is described. Based on interconnect systems where the solder layer was electrically connected only to two nickel electromigration barrier layers, electromigration performance was hindered by the formation of nickel-rich intermetallic compounds at the surface of the nickel electromigration barrier layers. By introducing sources of copper into this system, the formation of these nickel-rich intermetallic compounds is reduced in favor of providing, for example, intermetallic compounds with greater copper concentrations. The preferable formation of these copper-rich intermetallic compounds preserves the integrity of the nickel electromigration barrier layers and thus enhances electromigration performance.

1. First Embodiment

FIG. 1A shows a cross sectional view of a lead-free solder interconnect structure 100, according to one embodiment. Structure 100 includes a semiconductor substrate 110 electrically coupled to a solder layer 130.

Semiconductor substrate 110 includes a last metal layer 111. A copper pedestal 140 is connected to the semiconductor substrate 110 at a surface 112 of the last metal layer 111. The copper pedestal 140 is preferably 8 micrometers (μm) to 12 μm thick. In this embodiment, the copper pedestal 140 may be approximately 10 μm thick. The last metal layer 111 forms an electrical connection between the semiconductor substrate 110 and the copper pedestal 140. An electromigration barrier layer 150 is then connected to the top of the copper pedestal 140. The electromigration barrier layer 150 is preferably 1 μm to 3 μm thick. In this embodiment, the electromigration barrier layer 150 may be approximately 2 μm of nickel; other embodiments may use other materials as an electromigration barrier layer including, for example, iron, nickel-iron, or cobalt. A barrier protection layer 160 is then connected to the top of electromigration barrier layer 150. The barrier protection layer 160 is preferably 0.5 µm to 3 µm thick. In this embodiment, the barrier protection layer 160 is 1 µm thick and consists of copper. Upon reflow of the solder layer 130, some or all of the barrier protection layer 160 may be converted to intermetallic compounds. Collectively, the copper pedestal 140, the electromigration barrier layer 150, and the barrier protection layer 160 will be referred to as an assembled pedestal structure 200.

As illustrated in FIG. 1A, the solder layer 130 extends out from a surface 113 of the semiconductor substrate 110, such that the solder layer 130 encapsulates the assembled pedestal structure 200 Alternatively, the solder layer 130 may only partially encapsulate the assembled pedestal structure 200, as shown in FIG. 1B. In this embodiment, the solder layer 130 may consist of a tin-silver mixture. Alternative embodiments may feature any of a large number of other lead-free solders.

Figure 6:
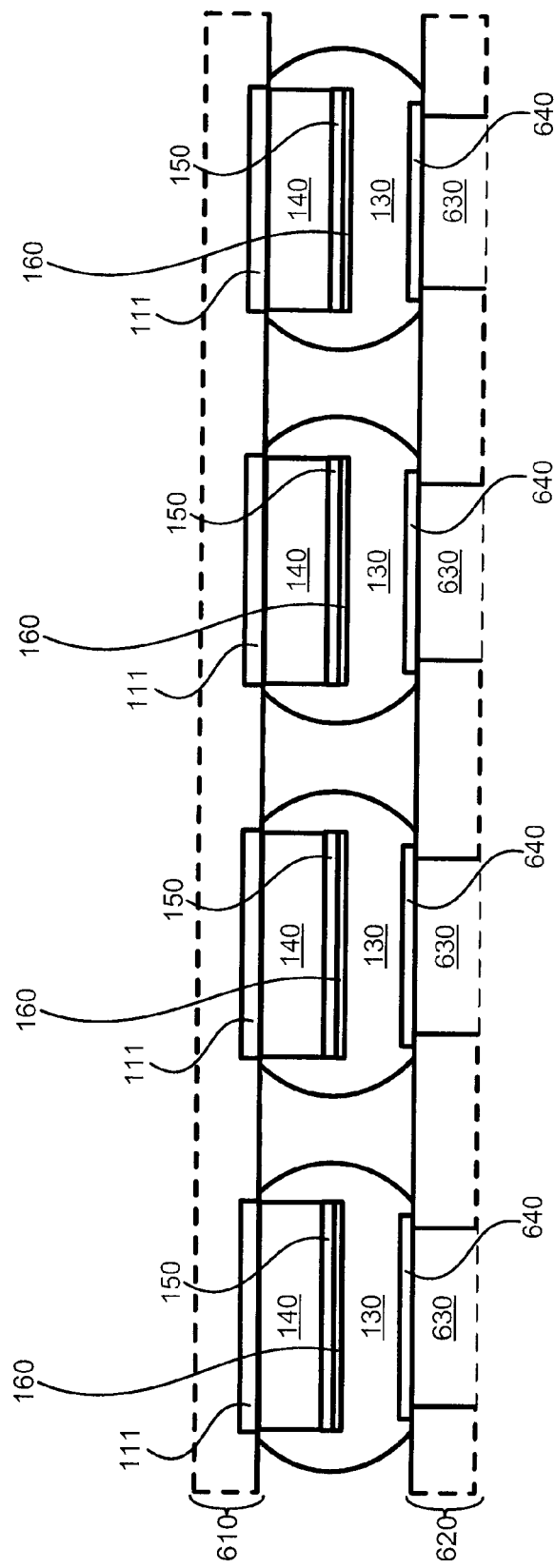
FIG. 6 depicts a microelectronic package including multiple instances of the exemplary embodiment of FIG. 1A.

FIG. 6 depicts a microelectronic package containing a first semiconductor substrate 610 and a second substrate 620. The second substrate 620 may be ceramic or organic and includes a plurality of terminal metal contacts 630. The terminal metal contacts 630 may be made of, for example, copper, nickel, cobalt, cobalt-iron, or nickel-iron. An electromigration barrier layer 640 cover the exposed surface of the terminal metal contact 630. After a plurality of interconnect structures 100 are formed on a plurality of last metal layers 111, the semiconductor substrate 610 may be joined to the substrate 620, so that at least one least metal layer 111 is aligned with a corresponding terminal metal contact 640. As FIG. 6 illustrates, microelectronic packages typically require a large number of electrical connections to be made over a small area. The disclosed invention thus allows, among other things, for the further miniaturization of these connections while improving their connective reliability and integrity.

The following sections outline three methods for fabricating the embodiments depicted in FIGS. 1A-1D. The disclosed methods should not be considered exhaustive; other methods of fabrication may be utilized to form the structure. Within each method embodiment, additional steps may be included to form features unrelated to the disclosed structures. The second embodiment forms the assembled pedestal structure 200 and solder layer 130 on the semiconductor substrate 110 by electroplating. The solder layer 130 is then formed around assembled pedestal structure 200 through application of a mold. The third embodiment forms the assembled pedestal structure 200 on the semiconductor substrate 110 by electroplating. A solder-filled mold is then pressed down on the assembled pedestal structure 200, transferring the solder to the assembled pedestal structure 200 to form solder layer 130. The fourth embodiment forms the assembled pedestal structure 200 on the semiconductor substrate 110 by electroplating. Solder is then deposited on the assembled pedestal structure in an offset manner to form a solder layer 130 in at least partial contact with only one side of the copper pedestal 140.

2. Second Embodiment

Figure 2D:
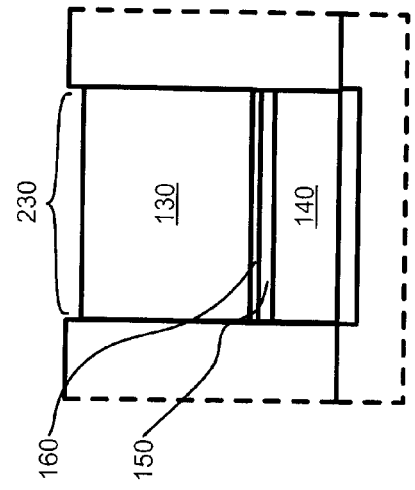
Figure 2A:
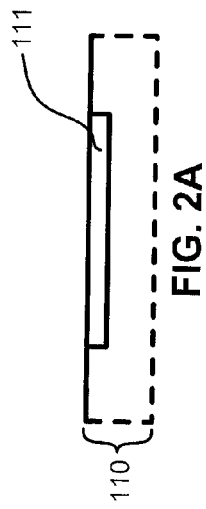

FIGS. 2A to 2H depict a process for manufacturing the embodiment of FIG. 1A. First, as shown in FIG. 2A, the semiconductor substrate 110 having the last metal layer 111 is present.

Next, as shown in FIG. 2B, a photo resist layer 210 is applied to the surface 113 of the semiconductor substrate 110. A seed layer (not shown) is applied between the surface of the substrate and the photoresist layer to facilitate later electroplating.

Figure 2C:
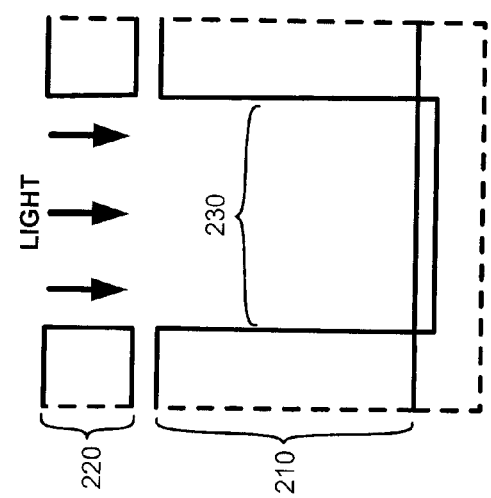

Next, as shown in FIG. 2C, the photoresist layer 210 is exposed using a mask 220 to form the region 230 in the photo resist layer 210.

Next, as shown in FIG. 2D, the copper pedestal 140, the electromigration barrier layer 150, the barrier protection layer 160, and the solder layer 130 are formed in the region 230 by an electroplating technique.

Next, as shown in FIG. 2E, the photoresist layer 210 (shown in FIGS. 2C-2D) and the seed layer (not shown) are removed, leaving the assembled pedestal structure 200 and the solder layer 130 attached to the semiconductor substrate 110.

Due to surface tension, the solder layer 130 remains balled up on the surface of the barrier protection layer 160 and will not naturally or controllably contact the sides of the copper pedestal 140. Therefore, as shown in FIGS. 2F-2G, a mold 500, shown in greater detail in FIGS. 5A-5C, is used to physically force the solder over the copper pedestal 140, in order to create contact between the solder and exposed sides of the copper pedestal 140.

Figure 5A:
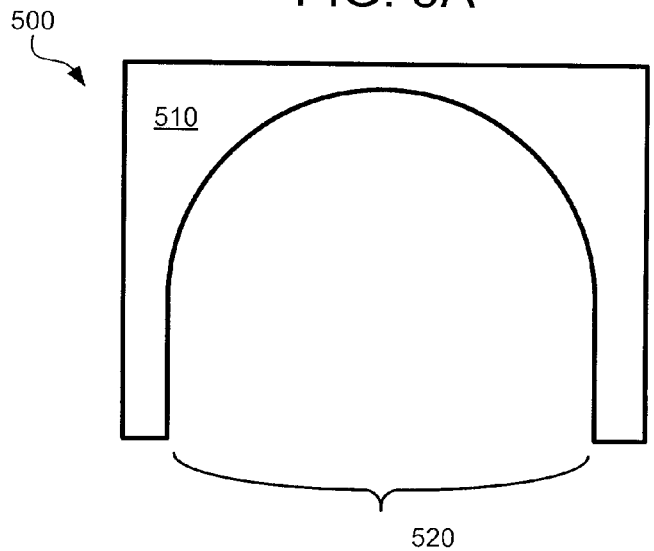
FIGS. 5A-5C depicts a mold used in the construction of the exemplary embodiment according to the methods depicted in FIGS. 2A-2F and FIGS. 3A-3F.
Figure 5B:
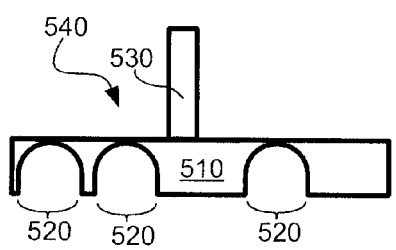
Figure 5C:
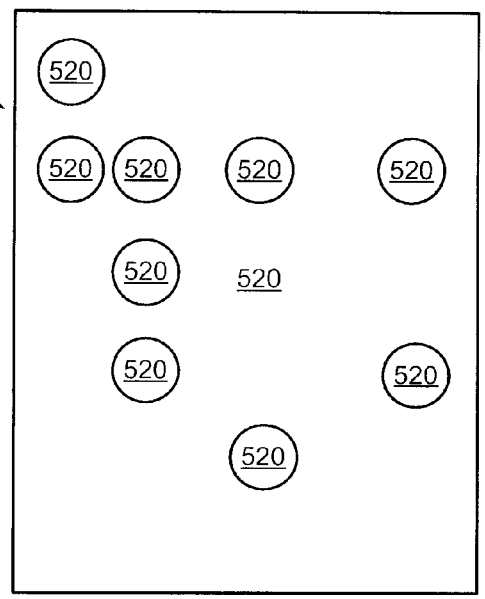

FIGS. 5A-5C depicts the mold 500 that may be used to form the solder layer 130 around the copper pedestal. FIG. 5A depicts a mold body 510 and an empty region 520. In this embodiment, the mold body 510 may be made of glass. Alternatively, the mold body 510 may be made of any insulating material. The shape of the empty region 520 may be modified to accommodate different geometries of the solder layer 130. FIG. 5B depicts a side-view of one embodiment of a mold 540, which features a mold body 510 and multiple empty regions 520 used to form multiple interconnect structures simultaneously. The mold body 510 may attached to a rod 530. The rod 530 may used to apply downward force to the mold body 510 and shape the solder layer as desired. It will be understood by those skilled in the art that the rod 530 is just one of many means of bringing together the mold 500 and structure 100, and that any of those means may be utilized without departing from the scope of the invention. FIG. 5C depicts a bottom view of mold 540, where an array of empty regions 520 is visible.

As shown in FIG. 2F, the mold 500 is positioned over the assembled pedestal structure 200, the solder layer 130 is heated to reflow temperature in a chemically reducing environment. In this embodiment, this environment is provided by about 5% formic acid in nitrogen, formed by bubbling nitrogen gas through a formic acid solution.

As shown in FIG. 2G, the mold 500 is then pressed toward the surface 113 of the semiconductor substrate 110 until the solder layer 130 is forced to wet at least one side of the copper pedestal 140. Upon reflow, some or all of the barrier protection layer 160 will be converted to tin-copper intermetallics, for example, $Cu_6Sn_5$ or $Cu_3Sn$. The mold 500 is then removed (not shown), leaving the formed structure according to the embodiment depicted in FIG. 1A. It is possible, either by design or due to misalignment, for the mold 500 to not be symmetrically aligned over the assembled pedestal structure. The resulting structure would more closely resemble the embodiment depicted in FIG. 1B. Additionally, as depicted in FIGS. 1C-1D, the solder layer 130 may not completely cover the sidewall of the copper pedestal 140.

3. Third Embodiment

The third embodiment begins similarly to the second embodiment, with the semiconductor substrate 110 having the last metal layer 111, as shown in FIG. 3A.

Next, as shown in FIG. 3B, the photo resist layer 210 is applied to the surface 113 of the semiconductor substrate 110.

A seed layer (not shown) is applied between the surface of the substrate and the photoresist layer to facilitate later electroplating.

Next, as shown in FIG. 3C, the photoresist layer 210 is selective exposed using mask 220 to form the region 230 in photoresist layer 210.

Next, as shown in FIG. 3D, the copper pedestal 140, the electromigration barrier layer 150, and the barrier protection layer 160 are formed in region 230 by electroplating.

Next, as shown in FIG. 3E, the photoresist layer 210 (shown in FIGS. 3C-3D) and the seed layer (not shown) are removed, leaving the assembled pedestal structure 200 attached to the semiconductor substrate 110.

Next, as shown in FIG. 3F a mold 500, shown in greater detail in FIGS. 5A-5C, is filled with a solder 330 and positioned over the assembled pedestal structure 200.

FIG. 5A-5C depict the glass mold 500 used to form the solder layer 130 around the copper pedestal. FIG. 5A depicts a mold body 510 and an empty region 520. In this embodiment, the mold body 510 may be made of glass. Alternatively, the mold body 510 may be made of any insulating material. The shape of the empty region 520 may be modified to accommodate different geometries of the solder layer 530. FIG. 5B depicts a side-view of one embodiment of a mold 540, which features a mold body 510 and multiple empty regions 520 to form multiple interconnect structures simultaneously. The mold body 510 is attached to a rod 530. The rod 530 is used to apply downward force to the mold body 510 and shape the solder layer as desired. It will be understood by those skilled in the art that the rod 530 is just one of many means of bringing together the mold 500 and structure 100, and that any of those means may be utilized without departing from the scope of the invention. FIG. 5C depicts a bottom view of mold 540, where an array of empty regions 520 is visible.

Next, the solder-filled mold 500 and semiconductor substrate 110 with assembled pedestal structure 200 are heated to reflow temperature and placed in a chemically reducing environment (not shown). In this embodiment, this environment is provided by about 5% formic acid in nitrogen, formed by bubbling nitrogen gas through a formic acid solution.

As shown in FIG. 3G, the solder-filled mold 500 is then pressed over the assembled pedestal structure 200 to transfer the solder 330 to the semiconductor substrate 110 to form solder layer 130. Upon reflow, some or all of barrier protection layer 160 will be converted to tin-copper intermetallics, for example $Cu_6Sn_5$ or $Cu_3Sn$. The mold 500 is then removed (not shown), leaving the formed structure according to the embodiment depicted in FIG. 1A. It is possible, either by design or due to misalignment, for the mold 500 to not be symmetrically aligned over the assembled pedestal structure. The resulting structure would more closely resemble the embodiment depicted in FIG. 1B. Additionally, as depicted in FIGS. 1C-1D, the solder layer 130 may not completely cover the sidewall of the copper pedestal 140.

4. Fourth Embodiment

A fourth embodiment utilizes a second photoresist step in lieu of the physical mold of the first and second method embodiment. This embodiment again begins with the semiconductor substrate 110 having the last metal layer 111, as shown in FIG. 4A.

Next, as shown in FIG. 4B, a first photo resist layer 410 is applied to the surface 113 of the semiconductor substrate 110.

A seed layer (not shown) is applied between the surface of the substrate and the photoresist layer to facilitate later electroplating.

Next, as shown in FIG. 4C, the first photoresist layer 410 is exposed using the mask 220 to form the region 230 in the first photoresist layer 410.

Next, as shown in FIG. 4D, the copper pedestal 140, the electromigration barrier layer 150, and the barrier protection layer 160 are formed in the region 230 by electroplating.

Next, as shown in FIG. 4E, the first photoresist layer 410 is removed, leaving the assembled pedestal structure 200 attached to the semiconductor substrate 110.

Next, as shown in FIG. 4F, a second photoresist layer 440 is applied to cover the surface 113 of semiconductor substrate 110 and the assembled pedestal structure 200.

Next, as shown in FIG. 4G, the mask 220 is offset from its original position over the assembled pedestal structure 200 and the second photoresist layer 440 is exposed to create the region 450 so that a side of the copper pedestal 140 is at least partially accessible.

Next, as shown in FIG. 4H, the region 450 is filled with the plated solder 460 using electroplating. In an alternative embodiment (not shown), a thin layer of copper may be plated in region 450 before it is filled with solder. Next, as shown in FIG. 4I, the second photoresist layer 440 and the seed layer (not shown) are removed, leaving the assembled pedestal structure 200 attached to the semiconductor substrate 110 and plated solder 460 at least partially covering the top and side of the assembled pedestal structure 200.

Figure 4J:
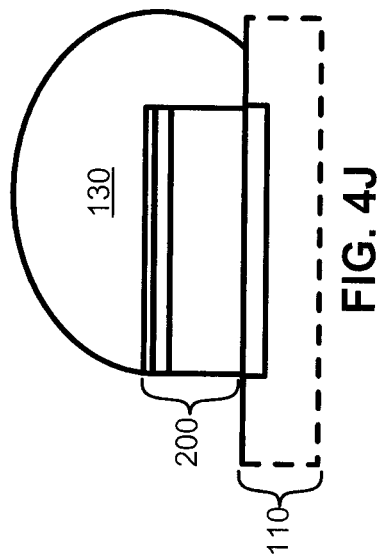
Figure 4I:
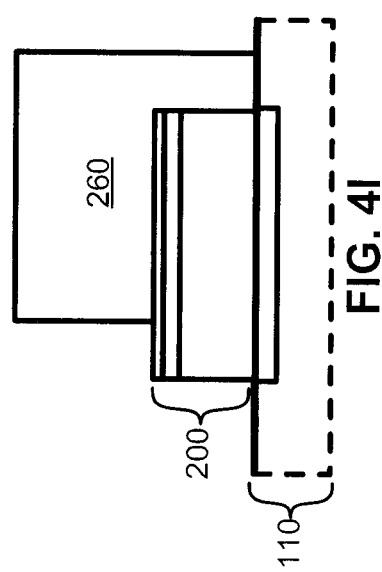

Next, as shown in FIG. 4J, the assembled pedestal structure 200 attached to the semiconductor substrate 110 and the plated solder 460 are placed in a chemically-reducing environment (not shown) and heated to reflow temperature so that the plated solder 460 is able to reform into the solder layer 160.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of forming an interconnect structure comprising:
   providing a semiconductor substrate having a metal layer;
   forming a copper pedestal having a first end coupled to the metal layer, at least one side, and a second end;
   forming an electromigration barrier layer on the copper pedestal, wherein the electromigration barrier layer is on the second end of the copper pedestal but not on the at least one side of the copper pedestal;
   forming a barrier protection layer located directly on the electromigration barrier layer;
   forming a solder layer on the barrier protection layer, wherein the formed barrier protection layer preserves the electromigration barrier layer by preventing the formation of intermetallic compounds comprising material from the underlying electromigration barrier layer during reflow of the formed solder layer; and
   pressing a mold over the solder layer so that the solder layer directly contacts the barrier protection layer, wherein the method is performed so that a formed interconnect structure for receiving a structure having a second semiconductor substrate to define a microelectronic package is characterized by the solder layer contacting the at least one side of the copper pedestal.

2. The method of claim 1, wherein the copper pedestal, barrier layer, barrier protection layer, and solder layer are formed by electroplating.

3. The method of claim 1, wherein the mold is pressed over the solder layer in a chemically reducing environment.

4. The method of claim 3, wherein the chemically reducing environment comprises formic acid in nitrogen.

5. The method of claim 1, wherein the mold comprises an insulating material.

6. The method of claim 1, wherein the mold comprises glass.

7. A method of forming an interconnect structure comprising:
   providing a semiconductor substrate having a metal layer;
   forming a copper pedestal having a first end coupled to the metal layer, at least one side, and a second end;
   forming a barrier layer on the copper pedestal, wherein the barrier layer is on the second end of the copper pedestal but not on the at least one side of the copper pedestal;
   forming a barrier protection layer on the barrier layer;
   forming a solder layer on the barrier protection layer; and
   pressing a mold over the solder layer wherein the method is performed so that a formed interconnect structure for receiving a structure having a second semiconductor substrate to define a microelectronic package is characterized by the solder layer contacting the at least one side of the copper pedestal.

8. The method of claim 7, wherein forming a solder layer on the barrier protection layer occurs in a chemically reducing environment.

9. The method of claim 8, wherein the chemically reducing environment comprises formic acid in nitrogen.

10. The method of claim 7, wherein forming a barrier protection layer on the electromigration barrier layer comprises forming a copper layer on the electromigration barrier layer.

11. The method of claim 1, wherein the at least one side of the copper pedestal defines a sidewall, and method is performed so that a formed interconnect structure for receiving a structure having a second semiconductor substrate to define a microelectronic package is characterized by the solder layer contacting an upper elevation of the sidewall but not contacting a lower elevation of the sidewall.

12. The method of claim 1, wherein the copper pedestal includes a first side and a second side, wherein the method is performed so that a formed interconnect structure for receiving a structure having a second semiconductor substrate to define a microelectronic package is characterized by the solder layer contacting the first side but not contacting the second side.

13. The method of claim 1, wherein the copper pedestal includes a first side and a second side, wherein the method is performed so that a formed interconnect structure for receiving a structure having a second semiconductor substrate to define a microelectronic package is characterized by the solder layer contacting an entirety of the first side and contacting only an upper elevation but not a lower elevation of the second side.

14. The method of claim 7, wherein the at least one side of the copper pedestal defines a sidewall, and method is performed so that a formed interconnect structure for receiving a structure having a second semiconductor substrate to define a microelectronic package is characterized by the solder layer contacting an upper elevation of the sidewall but not contacting a lower elevation of the sidewall.

15. The method of claim 7, wherein the copper pedestal includes a first side and a second side, wherein the method is performed so that a formed interconnect structure for receiving a structure having a second semiconductor substrate to define a microelectronic package is characterized by the solder layer contacting the first side but not contacting the second side.

16. The method of claim 7, wherein the method is performed so that a formed interconnect structure for receiving a structure having a second semiconductor substrate to define a microelectronic package is characterized by the solder layer contacting the copper pedestal to completely encapsulate the copper pedestal.

17. The method of claim 7, wherein the barrier protection layer is formed of copper.

18. The method of claim 17, wherein the method is performed so that a formed interconnect structure for receiving a structure having a second semiconductor substrate to define a microelectronic package is characterized by the solder layer having an elevation in common with an elevation of the metal layer.

19. The method of claim 17, wherein the copper pedestal includes a first side and a second side, wherein the method is performed so that a formed interconnect structure for receiving a structure having a second semiconductor substrate to define a microelectronic package is characterized by the solder layer contacting an entirety of the first side but not contacting the second side.

20. The method of claim 17, wherein the copper pedestal includes a first side and a second side, wherein the method is performed so that a formed interconnect structure for receiving a structure having a second semiconductor substrate to define a microelectronic package is characterized by the solder layer contacting an entirety of the first side and contacting only and upper elevation but not a lower elevation of the second side.

* * * * *